(12) United States Patent
Clark

(10) Patent No.: US 8,569,158 B2
(45) Date of Patent: *Oct. 29, 2013

(54) METHOD FOR FORMING ULTRA-SHALLOW DOPING REGIONS BY SOLID PHASE DIFFUSION

(75) Inventor: Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 48 days.

This patent is subject to a terminal disclaimer.

(21) Appl. No.: 13/077,721

(22) Filed: Mar. 31, 2011

(65) Prior Publication Data

US 2012/0252196 A1    Oct. 4, 2012

(51) Int. Cl.
*H01L 21/22* (2006.01)

(52) U.S. Cl.
USPC .................... 438/559; 438/561; 257/E21.135

(58) Field of Classification Search
USPC .................................................. 438/558–561
See application file for complete search history.

(56) References Cited

U.S. PATENT DOCUMENTS

| | | | |
|---|---|---|---|
| 5,281,552 A | 1/1994 | King et al. | |
| 5,407,847 A | 4/1995 | Hayden et al. | |
| 5,478,776 A * | 12/1995 | Luftman et al. | 438/301 |
| 5,998,271 A | 12/1999 | Schwalke | |
| 6,099,647 A | 8/2000 | Yieh et al. | |
| 6,150,243 A | 11/2000 | Wieczorek et al. | |
| 6,228,750 B1 * | 5/2001 | Shibib | 438/558 |
| 6,238,986 B1 | 5/2001 | Kepler et al. | |
| 6,686,630 B2 | 2/2004 | Hanafi et al. | |
| 6,858,532 B2 | 2/2005 | Natzle et al. | |
| 6,905,941 B2 | 6/2005 | Doris et al. | |
| 7,041,538 B2 | 5/2006 | Ieong et al. | |
| 7,105,427 B1 | 9/2006 | Chu et al. | |
| 7,112,516 B2 | 9/2006 | Chakravarthi et al. | |
| 7,250,658 B2 | 7/2007 | Doris et al. | |
| 7,723,233 B2 | 5/2010 | Krull et al. | |
| 7,727,845 B2 | 6/2010 | Wang et al. | |
| 7,935,591 B2 | 5/2011 | Rouh et al. | |
| 8,288,292 B2 | 10/2012 | Antonelli et al. | |
| 2003/0067037 A1 * | 4/2003 | Lu et al. | 257/347 |
| 2004/0191998 A1 | 9/2004 | Natzle et al. | |
| 2005/0260347 A1 * | 11/2005 | Narwankar et al. | 427/248.1 |
| 2006/0014396 A1 * | 1/2006 | Chen et al. | 438/757 |
| 2006/0063346 A1 * | 3/2006 | Lee et al. | 438/393 |

(Continued)

FOREIGN PATENT DOCUMENTS

WO    WO 01/11668 A1    2/2001

OTHER PUBLICATIONS

United States Patent and Trademark Office, International Search Report and Written Opinion in related PCT Application No. PCT/US10/31410, dated Jul. 3, 2012, 15 pages.

(Continued)

*Primary Examiner* — Savitr Mulpuri

(57) ABSTRACT

A method for forming an ultra-shallow dopant region in a substrate is provided. In one embodiment, the method includes depositing a dopant layer in direct contact with the substrate, the dopant layer containing an oxide, a nitride, or an oxynitride, where the dopant layer contains a dopant selected from aluminum (Al), gallium (Ga), indium (In), thallium (Tl), nitrogen (N), phosphorous (P), arsenic (As), antimony (Sb), and bismuth (Bi). The method further includes patterning the dopant layer; and forming the ultra-shallow dopant region in the substrate by diffusing the dopant from the patterned dopant layer into the substrate by a thermal treatment.

6 Claims, 9 Drawing Sheets

(56) References Cited

U.S. PATENT DOCUMENTS

| | | | |
|---|---|---|---|
| 2006/0194435 | A1 | 8/2006 | Nishimura et al. |
| 2006/0237791 | A1 | 10/2006 | Doris et al. |
| 2008/0224273 | A1 | 9/2008 | America et al. |
| 2008/0254606 | A1 | 10/2008 | Baek et al. |
| 2008/0315293 | A1* | 12/2008 | Ji et al. ............ 257/324 |
| 2008/0315295 | A1* | 12/2008 | Ji et al. ............ 257/325 |
| 2010/0048005 | A1 | 2/2010 | Seebauer |
| 2010/0240172 | A1* | 9/2010 | Rana et al. ............ 438/96 |
| 2011/0129990 | A1* | 6/2011 | Mandrekar et al. ............ 438/558 |
| 2011/0269287 | A1* | 11/2011 | Tsai et al. ............ 438/306 |
| 2012/0168613 | A1 | 7/2012 | Yu et al. |
| 2012/0252197 | A1* | 10/2012 | Clark ............ 438/559 |

OTHER PUBLICATIONS

Kalkofen et al. "P-type Doping of Silicon Suitable for Structures with High Aspect Ratios by Using a Dopant Source of Boron Oxide Grown by Atomic Layer Deposition," ECS Transactions, 45(6) 55-67 (2012).

Kim et al. "A Novel Doping Technology for Ultra-shallow Junction Fabrication: Boron diffusion from Boron-adsorbed Layer by Rapid Thermal Annealing," Thin Solid Films 369 (2000) 207-212.

Ho et al. "Wafer-Scale, Sub-5 nm Junction Formation by Monolayer Doping and Conventional Spike Annealing," Nano Letter, 95 (2) (2009) 725-730.

United States Patent and Trademark Office, Office Action mailed on Feb. 26, 2013, for related U.S. Appl. No. 13/077,688, 15 pages.

Kalkofen et al. "Atomic layer deposition of boron oxide as dopant source for shallow doping of silicon", 217th Electrochemical Society Meeting, Abstract #943, 1 page.

217th ECS Meeting, Vancouver, Canada, Apr. 25-30, 2010, Meeting program, (pertinent pages: cover sheet, p. 1 and p. 69), which establishes specific ate of Abstract #943 of Kalkofen et al.

* cited by examiner

METHOD FOR FORMING ULTRA-SHALLOW DOPING REGIONS BY SOLID PHASE DIFFUSION

CROSS-REFERENCE TO RELATED APPLICATIONS

This application is related to co-pending U.S. patent application Ser. No. 13/077,688, entitled "METHOD FOR FORMING ULTRA-SHALLOW BORON DOPING REGIONS BY SOLID PHASE DIFFUSION," filed on even date herewith. The entire contents of this application are herein incorporated by reference in its entirety.

FIELD OF INVENTION

The present invention generally relates to semiconductor devices and methods for forming the same, and more particularly to ultra-shallow dopant region formation by solid phase diffusion from a dopant layer into a substrate layer.

BACKGROUND OF THE INVENTION

The semiconductor industry is characterized by a trend toward fabricating larger and more complex circuits on a given semiconductor chip. The larger and more complex circuits are achieved by reducing the size of individual devices within the circuits and spacing the devices closer together. As the dimensions of the individual components within a device such as a metal oxide semiconductor (MOS) or bipolar transistor are reduced and the device components brought closer together, improved electrical performance can be obtained. However, attention must be given to the formation of doped regions in the substrate to insure that deleterious electrical field conditions do not arise.

As the size of device components such as the transistor gate in an MOS device and the emitter region in a bipolar device, are reduced, the junction depth of doped regions formed in the semiconductor substrate must also be reduced. The formation of shallow junctions having a uniform doping profile and a high surface concentration has proven to be very difficult. A commonly used technique is to implant dopant atoms into the substrate with an ion implantation apparatus. Using ion implantation, the high energy dopant atoms bombard the surface of the substrate at high velocity and are driven into the substrate. While this method has proven effective for the formation of doped regions having moderately deep junctions, the formation of ultra-shallow junctions using ion implantation is extremely difficult. Both the path of the energized dopant atoms within the substrate and the implant uniformity are difficult to control at the low energies necessary to form shallow implanted junctions. The implantation of energized dopant atoms damages the crystal lattice in the substrate which is difficult to repair. Dislocations resulting from the lattice damage can easily spike across a shallow junction giving rise to current leakage across the junction. Moreover, the implantation of p-type dopants such as boron, which diffuse rapidly in silicon, results in excessive dispersion of dopant atoms after they are introduced into the substrate. It then becomes difficult to form a highly confined concentration of p-type dopant atoms in a specified area in the substrate and especially at the surface of the substrate.

In addition, new device structures for transistors and memory devices are being implemented that utilize doped three-dimensional structures. Examples of such devices include, but are not limited to, FinFETs, tri-gate FETs, recessed channel transistors (RCATs), and embedded dynamic random access memory (EDRAM) trenches. In order to dope these structures uniformly it is desirable to have a doping method that is conformal. Ion implant processes are effectively line of site and therefore require special substrate orientations to dope fin and trench structures uniformly. In addition, at high device densities, shadowing effects make uniform doping of fin structures extremely difficult or even impossible by ion implant techniques. Conventional plasma doping and atomic layer doping are technologies that have demonstrated conformal doping of 3-dimensional semiconductor structures, but each of these is limited in the range of dopant density and depth that can be accessed under ideal conditions. Embodiments of the present invention provide a method for forming ultra-shallow doping regions that overcomes several of these difficulties.

SUMMARY OF THE INVENTION

A plurality of embodiments for ultra-shallow boron dopant region formation by solid phase diffusion from a boron dopant layer into a substrate layer is described. The dopant regions may be formed in planar substrates, in raised features on substrates, or in recessed features in substrates.

According to one embodiment, a method is provided for forming an ultra-shallow boron (B) dopant region in a substrate. The method includes depositing, by atomic layer deposition (ALD), a boron dopant layer in direct contact with the substrate, the boron dopant layer containing an oxide, a nitride, or an oxynitride formed by alternating gaseous exposures of a boron amide precursor or an organoboron precursor and a reactant gas. The method further includes patterning the boron dopant layer, and forming the ultra-shallow boron dopant region in the substrate by diffusing boron from the patterned boron dopant layer into the substrate by a thermal treatment.

According to some embodiments, a method is provided for forming an ultra-shallow dopant region in a raised feature or in a recessed feature in a substrate.

According to another embodiment, a method is provided for forming ultra-shallow dopant regions in a substrate. The method includes depositing, by atomic layer deposition (ALD), a first dopant layer containing a first dopant in direct contact with the substrate, and patterning the first dopant layer. The method further includes depositing, by ALD, a second dopant layer containing a second dopant in direct contact with the substrate adjacent the patterned first dopant layer, the first and second dopant layers containing an oxide, a nitride, or an oxynitride, where the first and second dopant layers contain an n-type dopant or a p-type dopant with the proviso that the first or second dopant layer do not contain the same dopant, and where the n-type dopant and the p-type dopant are selected from boron (B), aluminum (Al), gallium (Ga), indium (In), thallium (Tl), nitrogen (N), phosphorous (P), arsenic (As), antimony (Sb), and bismuth (Bi). The method further includes diffusing, by a thermal treatment, the first dopant from the first dopant layer into the substrate to form a first ultra-shallow dopant region in the substrate, and diffusing, by the thermal treatment, the second dopant from the second dopant layer into the substrate to form a second ultra-shallow dopant region in the substrate.

According to yet another embodiment, a method is provided for forming ultra-shallow dopant regions in a substrate. The method includes forming a patterned layer on the substrate, a patterned cap layer on the patterned layer, and a sidewall spacer abutting the substrate, the patterned cap layer, and the patterned layer, depositing, by atomic layer deposition (ALD), a first dopant layer containing a first dopant in direct contact with the substrate adjacent the sidewall spacer, depositing a first cap layer on the first dopant layer, and planarizing the first cap layer and the first dopant layer. The method further includes removing the patterned cap layer and the patterned layer, depositing a second dopant layer containing a second dopant in direct contact with the substrate adjacent the sidewall spacer, and depositing a second cap layer on the second dopant layer, the first and second dopant layers containing an oxide, a nitride, or an oxynitride, where the first and second dopant layers contain an n-type dopant or a p-type dopant with the proviso that the first or second dopant layer do not contain the same dopant, and where the n-type dopant and the p-type dopant are selected from boron (B), aluminum (Al), gallium (Ga), indium (In), thallium (Tl), nitrogen (N), phosphorous (P), arsenic (As), antimony (Sb), and bismuth (Bi). The method further includes, diffusing, by a thermal treatment, the first dopant from the first dopant layer into the substrate to form a first ultra-shallow dopant region in the substrate, and diffusing, by the thermal treatment, the second dopant from the second dopant layer into the substrate to form a second ultra-shallow dopant region in the substrate.

BRIEF DESCRIPTION OF THE DRAWINGS

In the accompanying drawings:

FIG. 6A shows a schematic cross-sectional view of a raised feature that embodiments of the invention may be applied to;

FIG. 7A shows a schematic cross-sectional view of a recessed feature that embodiments of the invention may be applied to.

DETAILED DESCRIPTION OF SEVERAL EMBODIMENTS

Figure 1A:
FIGS. 1A-1E show schematic cross-sectional views of a process flow for forming an ultra-shallow dopant region in a substrate according to an embodiment of the invention.

Methods for forming ultra-shallow dopant regions in semiconductor devices by solid phase diffusion from a dopant layer into a substrate layer are disclosed in various embodiments. The dopant regions can include, for example, ultra-shallow source-drain extensions for planar transistors, FinFETs, or tri-gate FETs. Other applications of ultra-shallow dopant region formation can include channel doping in replacement gate process flows, and for FinFET, or extremely thin silicon on insulator (ET-SOI) devices. Devices with extremely thin alternative semiconductor channels may also be doped using the disclosed method, for instance germanium on insulator devices (GeOI) or Ge FinFETs, and III-V channel devices such as GaAs, InGaAs, or InGaSb FinFETs. In addition, devices formed in amorphous Si or polycrystalline Si layers, such as EDRAM devices may utilize the disclosed method to adjust the Si doping level.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrase "in one embodiment" in various places throughout this specification are not necessarily referring to the same embodiment of the invention.

FIGS. 1A-1E show schematic cross-sectional views of a process flow for forming an ultra-shallow dopant region in a substrate according to an embodiment of the invention. FIG. 1A shows a schematic cross-sectional view of substrate 100. The substrate 100 can be of any size, for example a 200 mm substrate, a 300 mm substrate, or an even larger substrate. According to one embodiment, the substrate 100 can contain Si, for example crystalline Si, polycrystalline Si, or amorphous Si. In one example, the substrate 100 can be a tensile-strained Si layer. According to another embodiment, the substrate 100 may contain Ge or $Si_xGe_{1-x}$ compounds, where x is the atomic fraction of Si, 1−x is the atomic fraction of Ge, and 0<x<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can be a compressive-strained Ge layer or a tensile-strained $Si_xGe_{1-x}$ (x>0.5) deposited on a relaxed $Si_{0.5}Ge_{0.5}$ buffer layer. According to some embodiments, the substrate 100 can include a silicon-on-insulator (SOI).

Figure 1B:
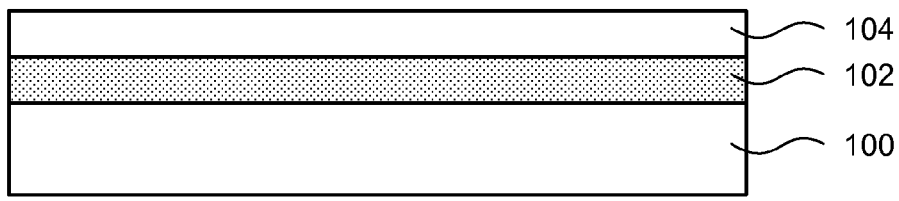

FIG. 1B shows a dopant layer 102 that may be deposited by atomic layer deposition (ALD) in direct contact with the substrate 100, and thereafter a cap layer 104 may be deposited on the dopant layer 102. In some examples, the cap layer 104 may be omitted from the film structures in FIGS. 1B-1D. The dopant layer 102 can include an oxide layer (e.g., $SiO_2$), a nitride layer (e.g., SiN), or an oxynitride layer (e.g., SiON), or a combination of two or more thereof. The dopant layer 102 can include one or more dopants from Group IIIA of the Periodic Table of the Elements: boron (B), aluminum (Al), gallium (Ga), indium (In), and thallium (Tl); and Group VA: nitrogen (N), phosphorous (P), arsenic (As), antimony (Sb), and bismuth (Bi). According to some embodiments, the dopant layer 102 can contain low dopant levels, for example between about 0.5 and about 5 atomic % dopant. According to other embodiments, the dopant layer 102 can contain medium dopant levels, for example between about 5 and about 20 atomic % dopant. According to yet other embodiments, the dopant layer can contain high dopant levels, for example greater than 20 atomic percent dopant. In some examples, a thickness of the dopant layer 102 can be 4 nanometers (nm) or less, for example between 1 nm and 4 nm, between 2 nm and 4 nm, or between 3 nm and 4 nm. However, other thicknesses may be used.

According to other embodiments, the dopant layer 102 can contain or consist of a doped high-k dielectric material in the form of an oxide layer, a nitride layer, or an oxynitride layer. The dopants in the high-k dielectric material may be selected from the list of dopants above. The high-k dielectric material can contain one or more metal elements selected from alkaline earth elements, rare earth elements, Group IIIA, Group IVA, and Group IVB elements of the Periodic Table of the Elements. Alkaline earth metal elements include beryllium (Be), magnesium (Mg), calcium (Ca), strontium (Sr), and barium (Ba). Exemplary oxides include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k dielectric material may contain $HfO_2$, HfON, HfSiON, $ZrO_2$, ZrON, ZrSiON, $TiO_2$, TiON, $Al_2O_3$, $La_2O_3$, $W_2O_3$, $CeO_2$, $Y_2O_3$, or $Ta_2O_5$, or a combination of two or more thereof. However, other dielectric materials are contemplated and may be used. Precursor gases that may be used in ALD of high-k dielectric materials are described in U.S. Pat. No. 7,772,073, the entire contents of which are hereby incorporated by reference.

The cap layer 104 may be an oxide layer, a nitride layer, or oxynitride layer, and can include Si and/or one or more of the high-k dielectric materials described above. The cap layer 104 may be deposited by chemical vapor deposition (CVD), or ALD, for example. In some examples, a thickness of the cap layer 104 can be between 1 nm and 100 nm, between 2 nm and 50 nm, or between 2 nm and 20 nm.

Figure 1C:
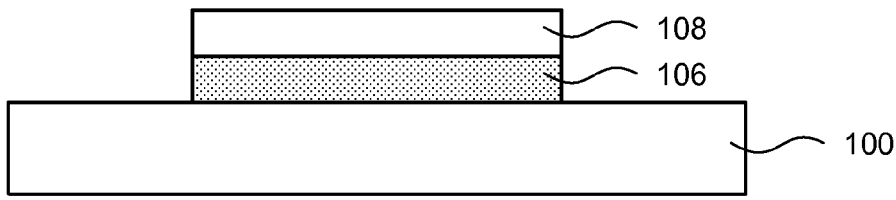

According to embodiments of the invention, film structure depicted in FIG. 1B may be patterned to form the patterned film structure schematically shown in FIG. 1C. For example, conventional photolithographic patterning and etching methods may be used to form the patterned dopant layer 106 and the patterned cap layer 108.

Figure 1D:
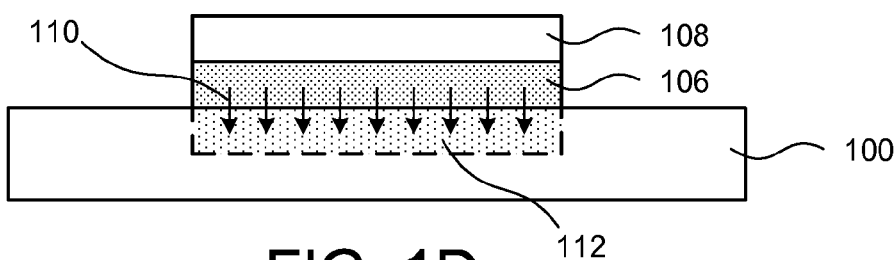

Thereafter, the patterned film structure in FIG. 1C may be thermally treated to diffuse a dopant 110 (e.g., B, Al, Ga, In, Tl, N, P, As, Sb, or Bi) from the patterned dopant layer 106 into the substrate 100 and form an ultra-shallow dopant region 112 in the substrate 100 underneath the patterned dopant layer 106 (FIG. 1D). The thermal treatment can include heating the substrate 100 in an inert atmosphere (e.g., argon (Ar) or nitrogen ($N_2$)) or in an oxidizing atmosphere (e.g., oxygen ($O_2$) or water ($H_2O$)) to a temperature between 100° C. and 1000° C. for between 10 seconds and 10 minutes. Some thermal treating examples include substrate temperatures between 100° C. and 500° C., between 200° C. and 500° C., between 300° C. and 500° C., and between 400° C. and 500° C. Other examples include substrate temperatures between 500° C. and 1000° C., between 600° C. and 1000° C., between 700° C. and 1000° C., between 800° C. and 1000° C., and between 900° C. and 1000° C. In some examples, the thermal treating may include rapid thermal annealing (RTA), a spike anneal, or a laser spike anneal.

In some examples, a thickness of the ultra-shallow dopant region 112 can be between 1 nm and 10 nm or between 2 nm and 5 nm. However, those skilled in the art will readily realize that the lower boundary of the ultra-shallow dopant region 112 in the substrate 100 may not be abrupt but rather characterized by gradual decrease in dopant concentration.

Figure 1E:
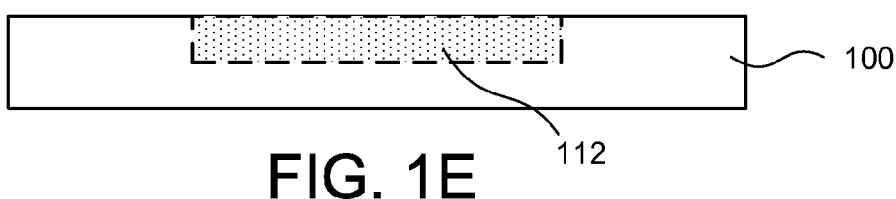

Following the thermal treatment and formation of the ultra-shallow dopant region 112, the patterned dopant layer 106 and the patterned cap layer 108 may be removed using a dry etching process or a wet etching process. The resulting structure is depicted in FIG. 1E. Additionally, a dry or wet cleaning process may be performed to remove any etch residues from the substrate 100 following the thermal treatment.

According to another embodiment of the invention, following deposition of a dopant layer 102 on the substrate 100, the dopant layer 102 may be patterned to form the patterned dopant layer 106, and thereafter, a cap layer may be conformally deposited over the patterned dopant layer 106. Subsequently the film structure in may be further processed as described in FIGS. 1D-1E to form the ultra-shallow dopant region 112 in the substrate 100.

Figure 6A:
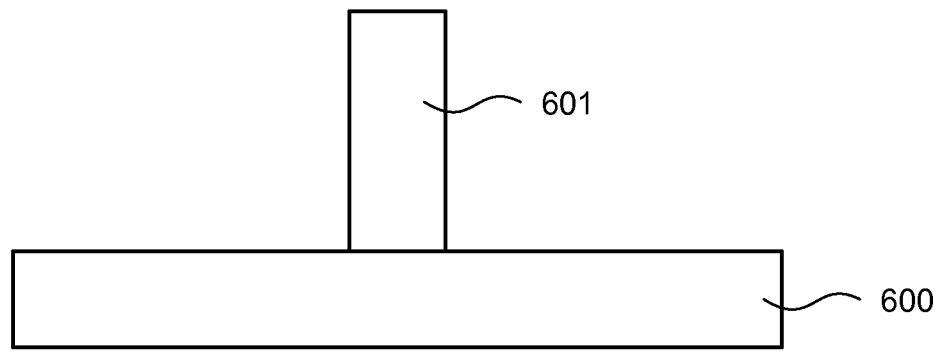

FIG. 6A shows a schematic cross-sectional view of a raised feature 601 that embodiments of the invention may be applied to. The exemplary raised feature 601 is formed on the substrate 600. The material of the substrate 600 and the raised feature 601 may include one or more of the materials described above for substrate 100 in FIG. 1A. In one example, the substrate 600 and the raised feature 601 can contain or consist of the same material (e.g., Si). Those skilled in the art will readily appreciate that embodiments of the invention may be applied to other simple or complex raised features on a substrate.

Figure 6B:
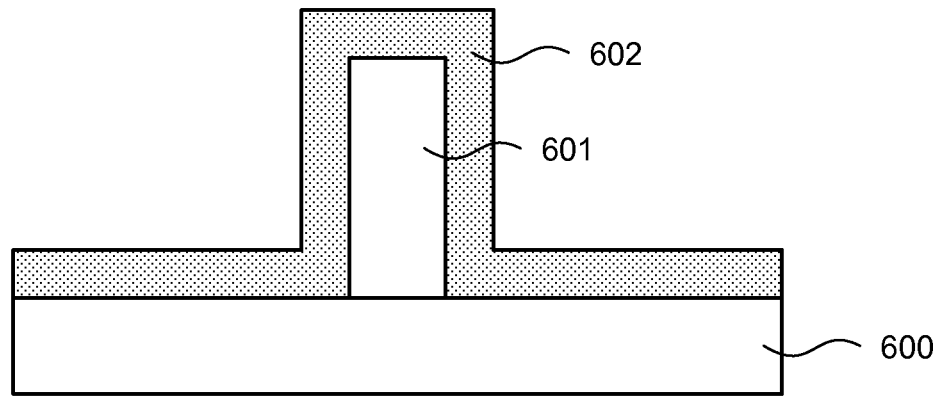
FIG. 6B shows a schematic cross-sectional view of a conformal dopant layer deposited on the raised feature of FIG. 6A.

FIG. 6B shows a schematic cross-sectional view of a conformal dopant layer 602 deposited on the raised feature 601 of FIG. 6A. The material of the conformal dopant layer 602 may include one or more of the materials described above for dopant layer 102 in FIG. 1B. The film structure in FIG. 6B may subsequently be processed similar to that described in FIG. 1C-1E, including, for example, depositing a cap layer (not shown) on the dopant layer 602, patterning the dopant layer 602 (not shown) and the cap layer (not shown) as desired, thermally treating the patterned layer dopant layer (not shown) to diffuse a dopant from the patterned dopant layer (not shown) into the substrate 600 and/or into the raised feature 601, and removing the patterned dopant layer (not shown) and the patterned cap layer (not shown).

Figure 7A:
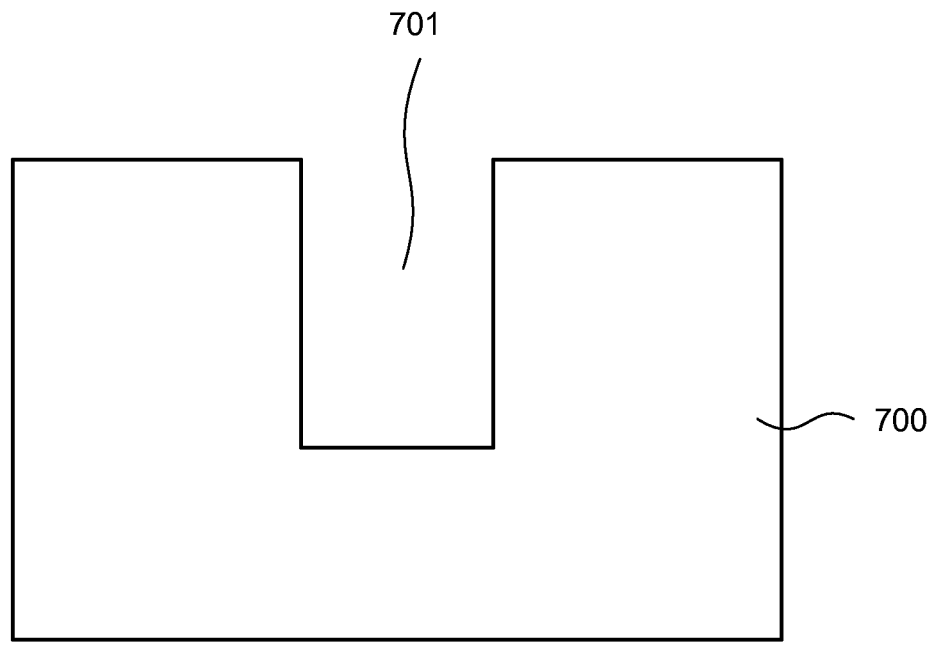

FIG. 7A shows a schematic cross-sectional view of a recessed feature 701 that embodiments of the invention may be applied to. The exemplary recessed feature 701 is formed in the substrate 700. The material of the substrate 700 may include one or more of the materials described above for substrate 100 in FIG. 1A. In one example, the substrate 700 can contain or consist of Si. Those skilled in the art will readily appreciate that embodiments of the invention may be applied to other simple or complex recessed features on a substrate.

Figure 7B:
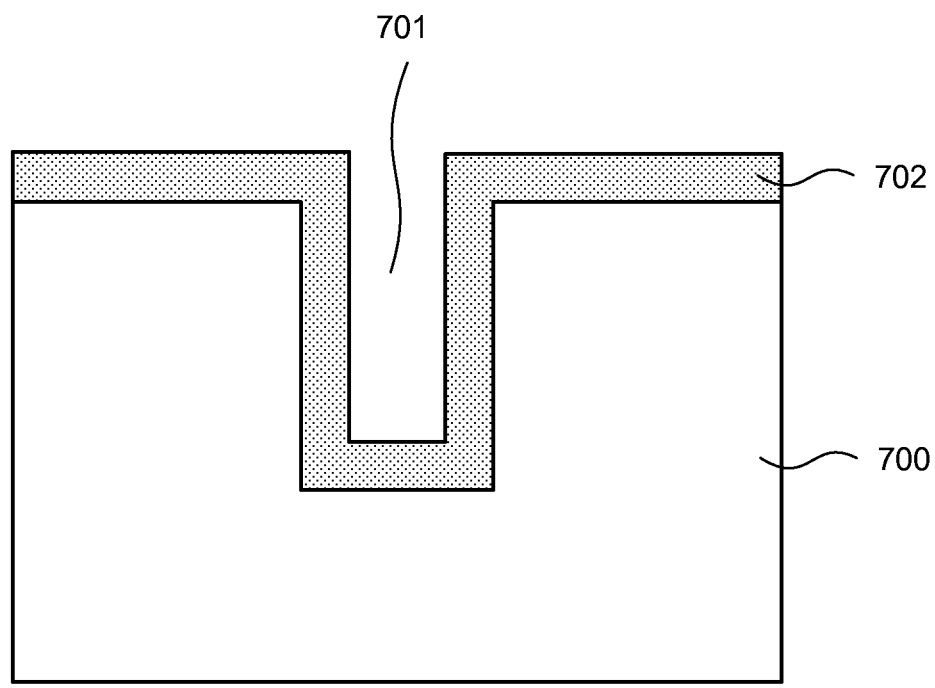
FIG. 7B shows a schematic cross-sectional view of a conformal dopant layer deposited in the recessed feature of FIG. 7B.

FIG. 7B shows a schematic cross-sectional view of a conformal dopant layer 702 deposited in the recessed feature 701 of FIG. 7A. The material of the conformal dopant layer 702 may include one or more of the materials described above for dopant layer 102 in FIG. 1B. The film structure in FIG. 7B may subsequently be processed similar to that described in FIG. 1C-1E, including, for example, depositing a cap layer (not shown) on the dopant layer 702, patterning the dopant layer 702 (not shown) and the cap layer (not shown) as desired, thermally treating the patterned layer dopant layer (not shown) to diffuse a dopant from the patterned dopant layer (not shown) into the substrate 700 in the recessed feature 701, and removing the patterned dopant layer (not shown) and the patterned cap layer (not shown).

FIGS. 2A-2E show schematic cross-sectional views of a process flow for forming an ultra-shallow dopant region in a substrate according to another embodiment of the invention. One or more of the materials (e.g., substrate, dopant layer, dopants, and cap layer compositions), processing conditions (e.g., deposition methods and thermal treating conditions), and layer thicknesses described above in reference to FIGS. 1A-1E may readily be used in the embodiment schematically described in FIGS. 2A-2E.

Figure 2A:
FIGS. 2A-2E show schematic cross-sectional views of a process flow for forming ultra-shallow dopant regions in a substrate according to another embodiment of the invention.
Figure 2B:
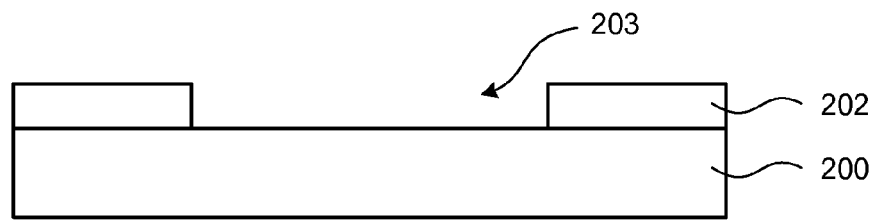

FIG. 2A shows a schematic cross-sectional view of substrate 200. FIG. 2B shows a patterned mask layer 202 formed on the substrate 200 to define a dopant window (well) 203 in the patterned mask layer 202 above the substrate 200. The patterned mask layer 202 may, for example, be a nitride hard mask (e.g., SiN hard mask) that can be formed using conventional photolithographic patterning and etching methods.

Figure 2C:
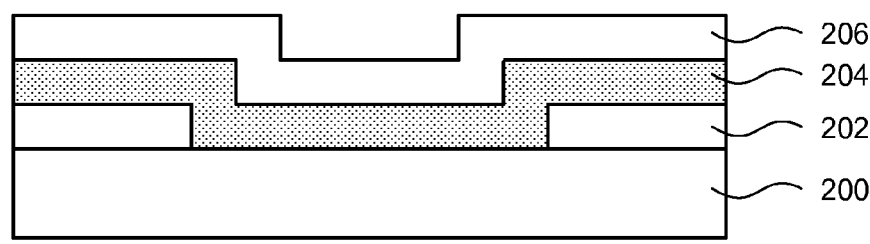

FIG. 2C shows a dopant layer 204 deposited by ALD in direct contact with the substrate 200 in the dopant window 203 and on the patterned mask layer 202, and a cap layer 206 be deposited on the dopant layer 204. The dopant layer 204 can contain a n-type dopant or a p-type dopant. In some examples, the cap layer 206 may be omitted from the film structures in FIGS. 2C-2D.

Figure 2D:
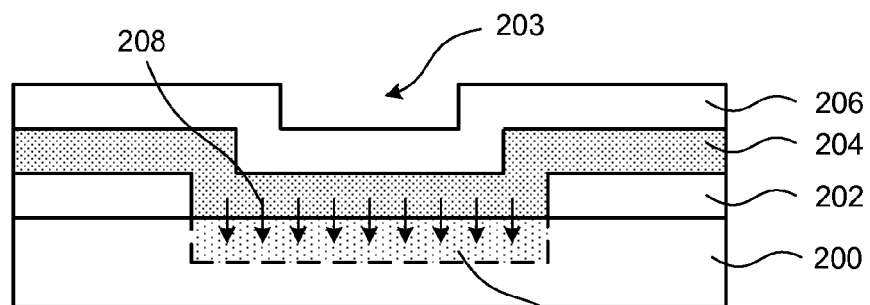

Thereafter, the film structure in FIG. 2C may be thermally treated to diffuse a dopant 208 from the dopant layer 204 into the substrate 200 and form an ultra-shallow dopant region 210 in the substrate 200 underneath the dopant layer 204 in the dopant window 203 (FIG. 2D). In some examples, a thickness of the ultra-shallow dopant region 210 can be between 1 nm and 10 nm or between 2 nm and 5 nm. However, those skilled in the art will readily realize that the lower boundary of the ultra-shallow dopant region 210 in the substrate 200 may not be abrupt but rather characterized by gradual decrease in dopant concentration.

Figure 2E:
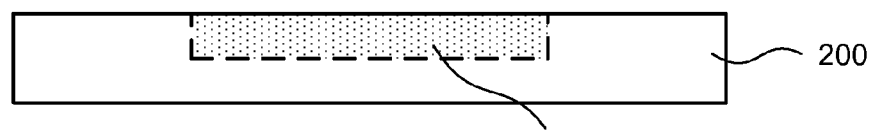

Following the thermal treatment and formation of the ultra-shallow dopant region 210, the patterned mask layer 202, the dopant layer 204, and the cap layer 206 may be removed using a dry etching process or a wet etching process (FIG. 2E). Additionally, a dry or wet cleaning process may be performed to remove any etch residues from the substrate 200 following the thermal treatment.

FIGS. 3A-3D show schematic cross-sectional views of a process flow for forming ultra-shallow dopant regions in a substrate according to yet another embodiment of the invention. The process flow shown in FIGS. 3A-3D can, for example, include channel doping in planar SOI, FinFET, or ET SOI. Further, the process flow may be utilized for forming self-aligned ultra-shallow source/drain extensions. One or more of the materials (e.g., substrate, dopant layer, dopants, and cap layer compositions), processing conditions (e.g., deposition methods and thermal treating conditions), and layer thicknesses described above in reference to FIGS. 1A-1E may readily be used in the embodiment schematically described in FIGS. 3A-3D.

Figure 3A:
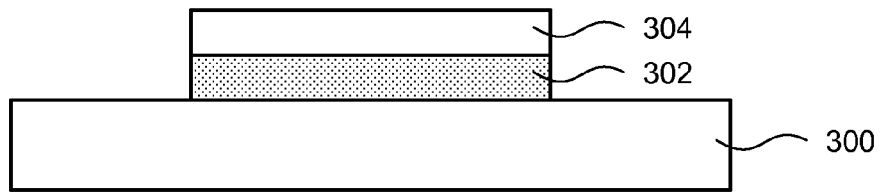
FIGS. 3A-3D show schematic cross-sectional views of a process flow for forming ultra-shallow dopant regions in a substrate according to yet another embodiment of the invention.

FIG. 3A shows a schematic cross-sectional view of a film structure similar to that of FIG. 1C and contains a patterned first dopant layer 302 directly in contact with a substrate 300 and a patterned cap layer 304 on the patterned first dopant layer 302. The patterned first dopant layer 302 can contain a n-type dopant or a p-type dopant.

Figure 3B:
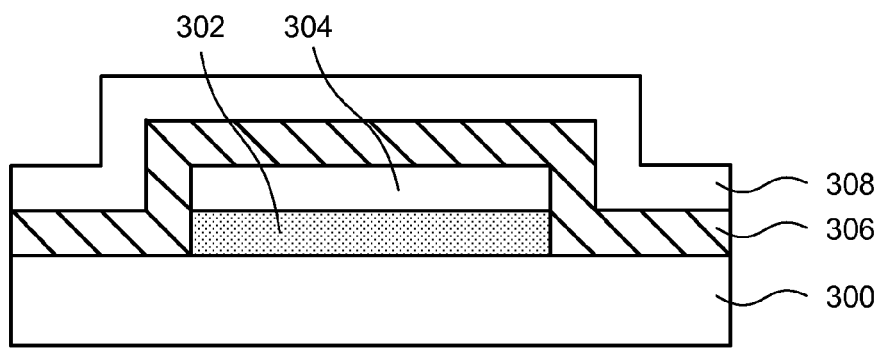

FIG. 3B shows a second dopant layer 306 that may be conformally deposited over the patterned cap layer 304 and directly on the substrate 300 adjacent the patterned first dopant layer 302, and a second cap layer 308 deposited over the second dopant layer 306. In some examples, the second cap layer 308 may be omitted from the film structures in FIGS. 3B-3C. The second dopant layer 306 can contain a n-type dopant or a p-type dopant with the proviso that second dopant layer 306 does not contain the same dopant as the patterned first dopant layer 302 and that only one of the patterned first dopant layer 302 and the second dopant layer 306 contains a p-type dopant and only one of the patterned first dopant layer 302 and the second dopant layer 306 contains a n-type dopant.

Figure 3C:
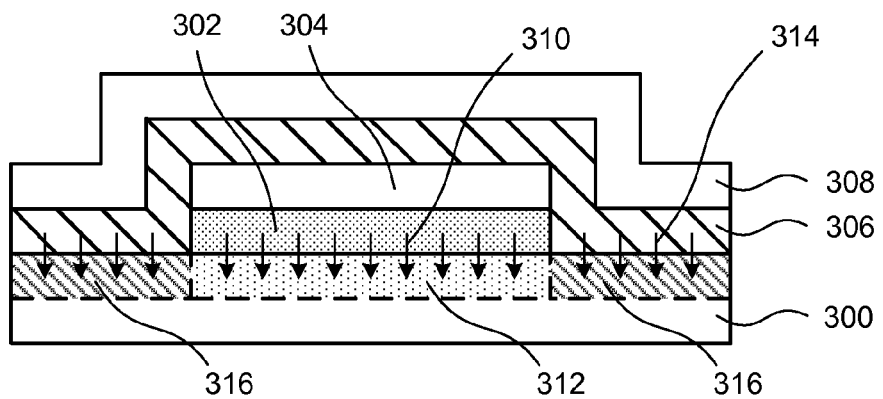

Thereafter, the film structure in FIG. 3B may be thermally treated to diffuse a first dopant 310 from the patterned first dopant layer 302 into the substrate 300 to form a first ultra-shallow dopant region 312 in the substrate 300 underneath the patterned first dopant layer 302. Further, the thermal treatment diffuses a second dopant 314 from the second dopant layer 306 into the substrate 300 to form a second ultra-shallow dopant region 316 in the substrate 300 underneath the second dopant layer 306 (FIG. 3C).

Figure 3D:
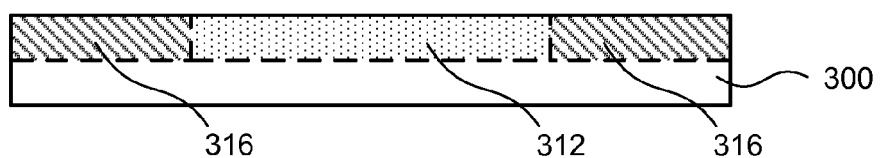

Following the thermal treatment, the first patterned dopant layer 302, patterned cap layer 304, second dopant layer 306, and second cap layer 308 may be removed using a dry etching process or a wet etching process (FIG. 3D). Additionally, a cleaning process may be performed to remove any etch residues from the substrate 300 following the thermal treatment.

FIGS. 4A-4F show schematic cross-sectional views of a process flow for forming ultra-shallow dopant regions in a substrate according to still another embodiment of the invention. The process flow shown in FIGS. 4A-4E may, for example, be utilized in a process for forming a gate last dummy transistor with self-aligned source/drain extensions. One or more of the materials (e.g., substrate, dopant layer, dopants, and cap layer compositions), processing conditions (e.g., deposition methods and thermal treating conditions), and layer thicknesses described above in reference to FIGS. 1A-1E may readily be used in the embodiment schematically FIGS. 4A-4F.

Figure 4A:
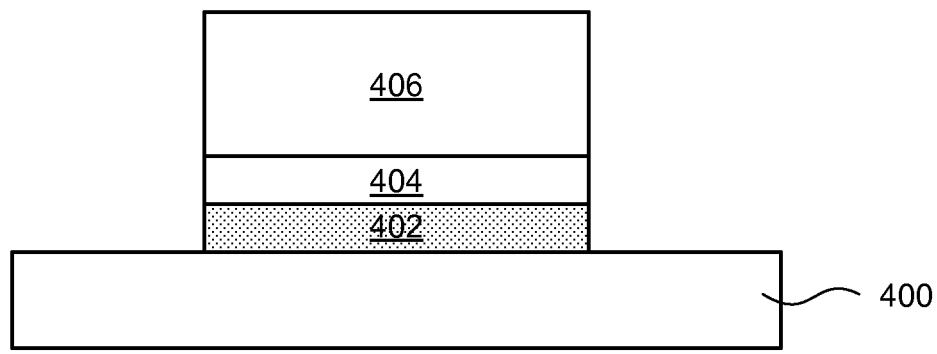
FIGS. 4A-4F show schematic cross-sectional views of a process flow for forming ultra-shallow dopant regions in a substrate according to still another embodiment of the invention.

FIG. 4A shows a schematic cross-sectional view of a film structure containing a patterned first dopant layer 402 on a substrate 400, a patterned cap layer 404 on the patterned first dopant layer 402, and patterned dummy gate electrode layer 406 (e.g., poly-Si) on the patterned cap layer 404. The patterned first dopant layer 402 can contain a n-type dopant or a p-type dopant. In some examples, the patterned cap layer 404 may be omitted from the film structures in FIGS. 4A-4E.

Figure 4B:
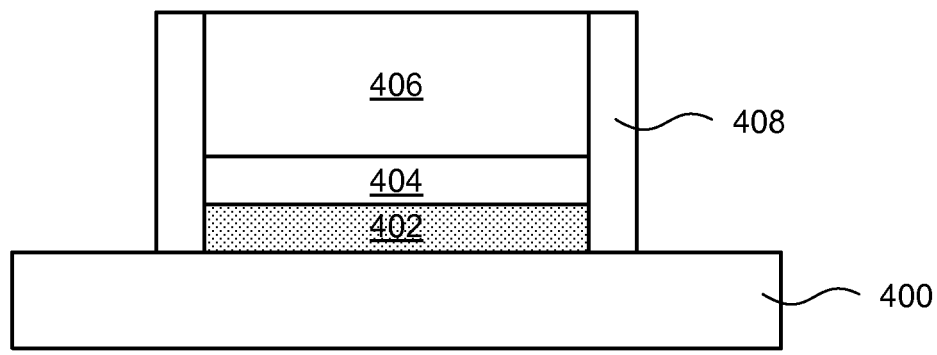

FIG. 4B schematically shows a first sidewall spacer layer 408 abutting the patterned dummy gate electrode layer 406, the patterned cap layer 404, and the patterned first dopant layer 402. The first sidewall spacer layer 408 may contain an oxide (e.g., $SiO_2$) or a nitride (e.g., SiN), and may be formed by depositing a conformal layer over the film structure in FIG. 4A and anisotropically etching the conformal layer.

Figure 4C:
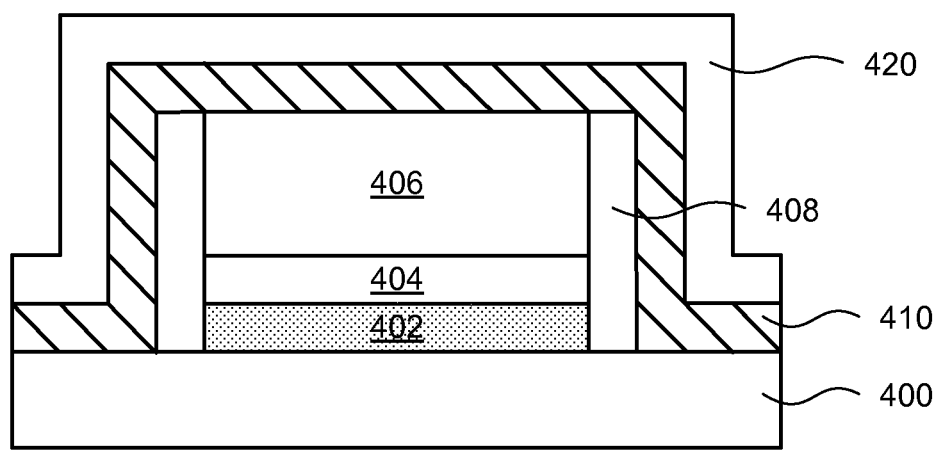
Figure 4D:
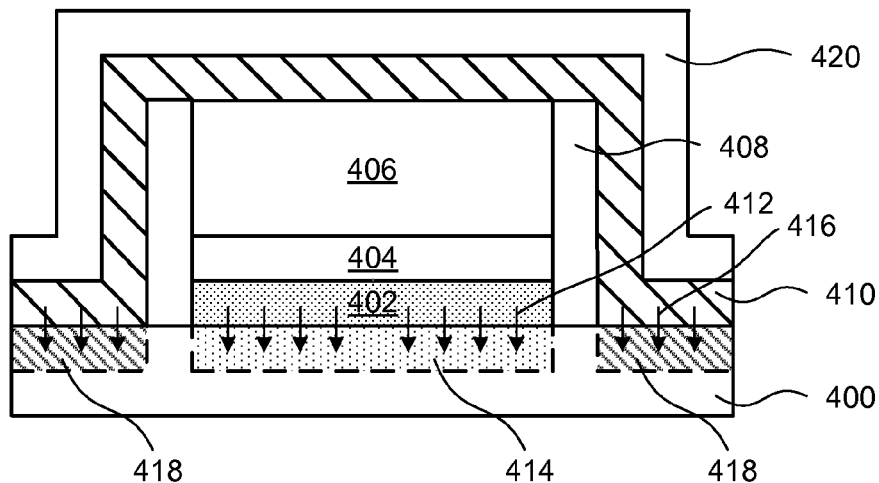

FIG. 4C shows a second dopant layer 410 that may be conformally deposited over the film structure shown in FIG. 4B, including in direct contact with the substrate 400 adjacent the first sidewall spacer layer 408. Further, a second cap layer 420 is conformally deposited over the second dopant layer 410. The second dopant layer 410 can contain a n-type dopant or a p-type dopant with the proviso that the second dopant layer 410 does not contain the same dopant as the patterned first dopant layer 402 and that only one of the patterned first dopant layer 402 and the second dopant layer 410 contains a p-type dopant and only one of the patterned first dopant layer 402 and the second dopant layer 410 contains a n-type dopant. In some examples, the second cap layer 420 may be omitted from the film structures in FIGS. 4C-4D.

Thereafter, the film structure in FIG. 4C may be thermally treated to diffuse a first dopant 412 from the patterned first dopant layer 402 into the substrate 400 and form a first ultra-shallow dopant region 414 in the substrate 400 underneath the patterned first dopant layer 402. Further, the thermal treatment diffuses a second dopant 416 from the second dopant layer 410 into the substrate 400 to form a second ultra-shallow dopant region 418 in the substrate 400 underneath the second dopant layer 410.

Figure 4E:
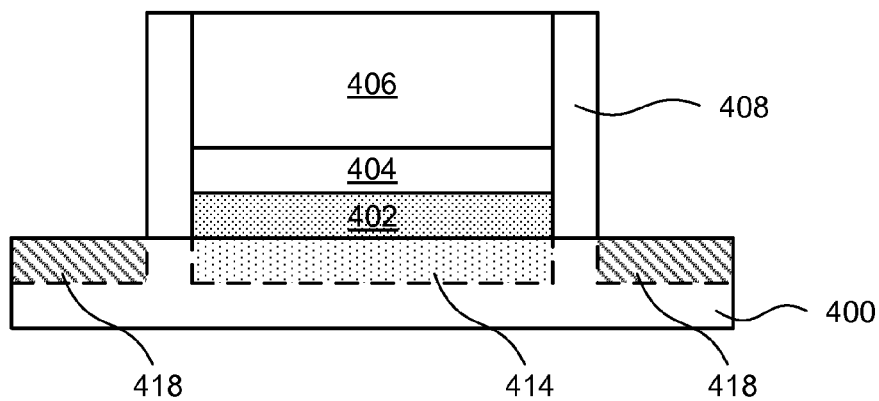

Following the thermal treatment, the second dopant layer 410 and the second cap layer 420 may be removed using a dry etching process or a wet etching process to form the film structure schematically shown in FIG. 4E. Additionally, a cleaning process may be performed to remove any etch residues from the substrate 400 following the thermal treatment.

Figure 4F:
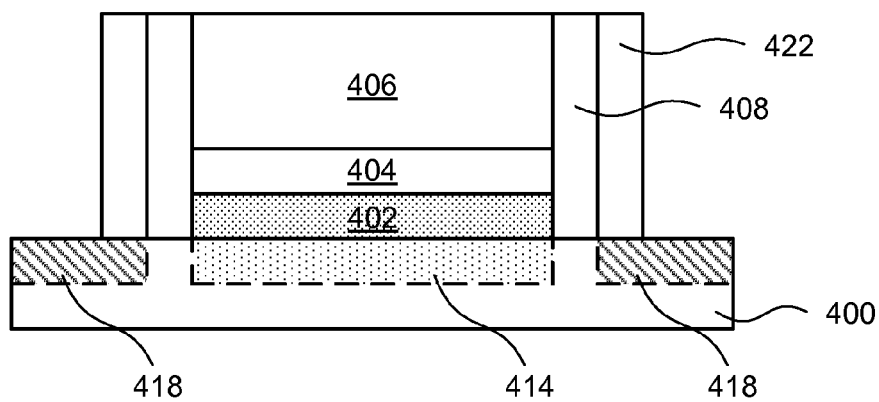

Next a second sidewall spacer layer 422 may be formed abutting the first sidewall spacer layer 408. This is schematically shown in FIG. 4F. The second sidewall spacer layer 422 may contain an oxide (e.g., $SiO_2$) or a nitride (e.g., SiN), and may be formed by depositing a conformal layer over the film structure and anisotropically etching the conformal layer.

Thereafter, the film structure shown in FIG. 4F may be further processed. The further processing can include forming additional source/drain extensions or performing a replacement gate process flow that includes ion implants, liner deposition, etc.

FIGS. 5A-5E show schematic cross-sectional views of a process flow for forming ultra-shallow dopant regions in a substrate according to another embodiment of the invention. The process flow shown in FIGS. 5A-5E may, for example, be utilized in a process for forming a spacer-defined P-i-N junction for band-to-band tunneling transistor. One or more of the materials (e.g., substrate, dopant layer, dopants, and cap layer compositions), processing conditions (e.g., deposition methods and thermal treating conditions), and layer thicknesses described above in reference to FIGS. 1A-E may readily be used in the embodiment schematically FIGS. 5A-5E.

Figure 5A:
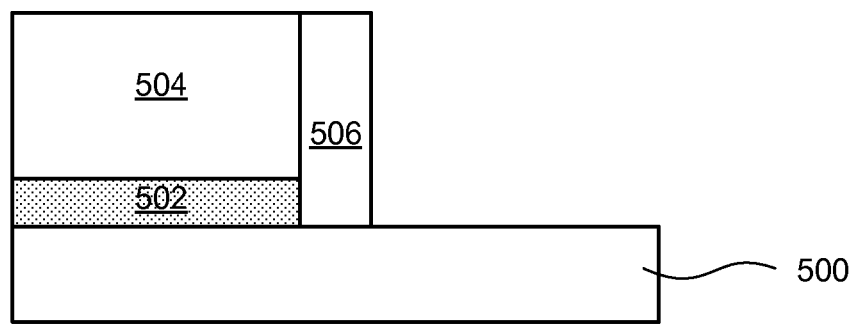
FIGS. 5A-5E show schematic cross-sectional views of a process flow for forming ultra-shallow dopant regions in a substrate according to another embodiment of the invention.

FIG. 5A shows a schematic cross-sectional view of a film structure that contains a patterned layer 502 (e.g., oxide, nitride, or oxynitride layer) on a substrate 500 and a patterned cap layer 504 (e.g., poly-Si) on the patterned layer 502. FIG. 5A further shows a sidewall spacer layer 506 abutting the substrate 500, the patterned cap layer 504, and the patterned layer 502. The sidewall spacer layer 506 may contain an oxide (e.g., $SiO_2$) or a nitride (e.g., SiN), and may be formed by depositing a conformal layer and anisotropically etching the conformal layer.

Figure 5B:
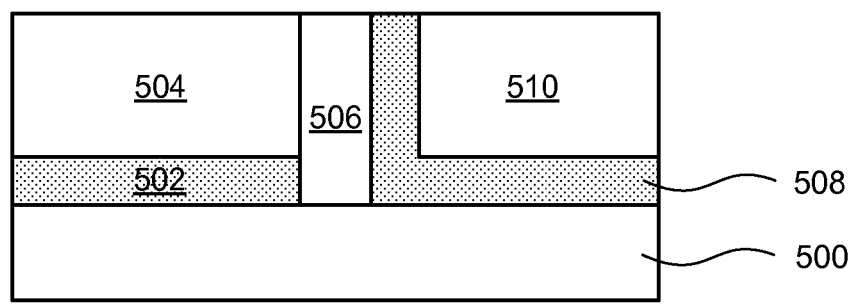

FIG. 5B shows a schematic cross-sectional view of a first dopant layer 508 containing a first dopant deposited by ALD in direct contact with the substrate 500 adjacent the sidewall spacer layer 506 and a first cap layer 510 (e.g., an oxide layer) deposited on the first dopant layer 508. The resulting film structure may be planarized (e.g., by chemical mechanical polishing, CMP) to form the film structure shown in FIG. 5B.

Thereafter, the patterned layer 502 and the patterned cap layer 504 may be removed using a dry etching process or a wet etching process. Subsequently, a second dopant layer 512 containing a second dopant may be deposited in direct contact with the substrate 500 and a second cap layer 514 (e.g., an oxide layer) deposited on the second dopant layer 512. The resulting film structure may be planarized (e.g., by CMP) to form the planarized film structure shown in FIG. 5C. The first dopant layer 508 and the second dopant layer 512 can contain a n-type dopant or a p-type dopant with the proviso that the first dopant layer 508 and the second dopant layer 512 do not contain the same dopant and only one of the first dopant layer 508 and the second dopant layer 512 contains a p-type dopant and only one of the first dopant layer 508 and the second dopant layer 512 contains a n-type dopant.

Figure 5C:
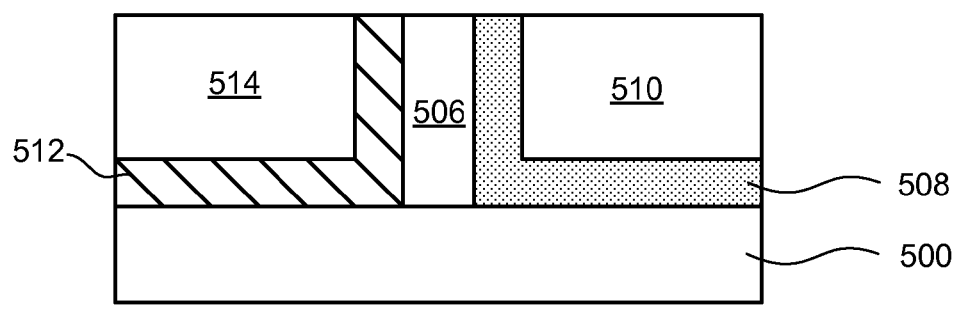
Figure 5D:
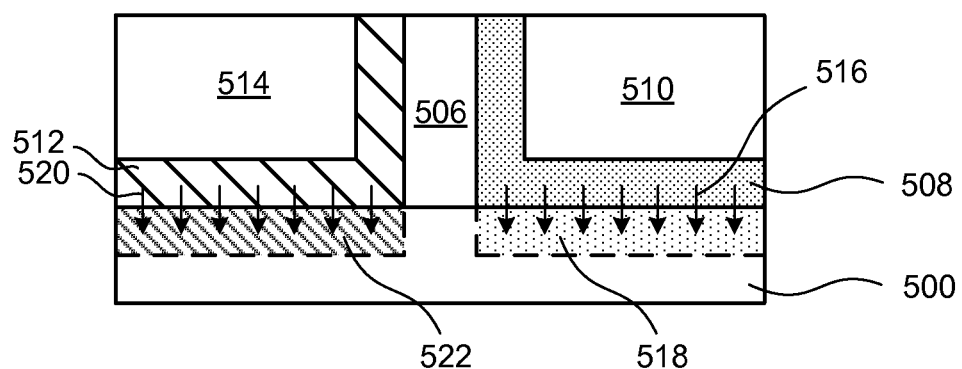
Figure 5E:
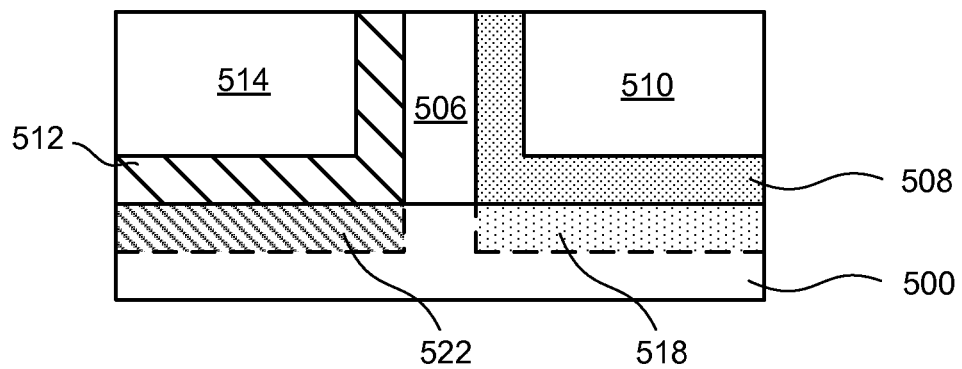

Thereafter, the film structure in FIG. 5C may be thermally treated to diffuse a first dopant 516 from the first dopant layer 508 into the substrate 500 and form a first ultra-shallow dopant region 518 in the substrate 500 underneath the first dopant layer 508. Further, the thermal treatment diffuses a second dopant 520 from the second dopant layer 512 into the substrate 500 to form a second ultra-shallow dopant region 522 in the substrate 500 underneath the second dopant layer 512 (FIG. 5D). FIG. 5E shows the spacer defined first and second ultra-shallow dopant regions 518 and 522 in the substrate 500.

Exemplary methods for depositing dopant layers on a substrate will now be described according to various embodiments of the invention.

According to one embodiment, a boron dopant layer may include boron oxide, boron nitride, or boron oxynitride. According to other embodiments, the boron dopant layer can contain or consist of a boron doped high-k material in the form of an oxide layer, a nitride layer, or an oxynitride layer. In one example, a boron oxide dopant layer may be deposited by ALD by a) providing a substrate in a process chamber configured for performing an ALD process, b) exposing the substrate to a vapor phase boron amide or an organoborane precursor, c) purging/evacuating the process chamber, d) exposing the substrate to a reactant gas containing $H_2O$, $O_2$, or $O_3$, a combination thereof, e) purging/evacuating the process chamber, and f) repeating steps b)-e) any number of times until the boron oxide dopant layer has a desired thickness. According to other embodiments, a boron nitride dopant layer may be deposited using a reactant gas containing $NH_3$ in step d), or a boron oxynitride dopant layer may be deposited using in step d) a reactant gas containing 1) $H_2O$, $O_2$, or $O_3$, and $NH_3$, or 2) NO, $NO_2$, or $N_2O$, and optionally one or more of $H_2O$, $O_2$, $O_3$, and $NH_3$.

According to embodiments of the invention, the boron amide may be include a boron compound of the form $L_nB(NR^1R^2)_3$ where L is a neutral Lewis base, n is 0 or 1, and each of $R^1$ and $R^2$ may be selected from alkyls, aryls, fluoroalkyls, fluoroaryls, alkoxyalkyls, and aminoalkyls. Examples of boron amides include $B(NMe_2)_3$, $(Me_3)B(NMe_2)_3$, and $B[N(CF_3)_2]_3$. According to embodiments of the invention, the organoborane may include a boron compound of the form $L_nBR^1R^2R^3$ where L is a neutral Lewis base, n is 0 or 1, and each of $R^1$, $R^2$ and $R^3$ may be selected from alkyls, aryls, fluoroalkyls, fluoroaryls, alkoxyalkyls, and aminoalkyls. Examples of boron amides include $BMe_3$, $(Me_3N)BMe_3$, $B(CF_3)_3$, and $(Me_3N)B(C_6F_3)$.

According to one embodiment, an arsenic dopant layer may include arsenic oxide, arsenic nitride, or arsenic oxynitride. According to other embodiments, the arsenic dopant layer can contain or consist of an arsenic doped high-k material in the form of an oxide layer, a nitride layer, or an oxynitride layer. In one example, an arsenic oxide dopant layer may be deposited by ALD by a) providing a substrate in a process chamber configured for performing an ALD process, b) exposing the substrate to a vapor phase precursor containing arsenic, c) purging/evacuating the process chamber, d) exposing the substrate to $H_2O$, $O_2$, or $O_3$, a combination thereof, e) purging/evacuating the process chamber, and f) repeating steps b)-e) any number of times until the arsenic oxide dopant layer has a desired thickness. According to other embodiments, an arsenic nitride dopant layer may be deposited using $NH_3$ in step d), or an arsenic oxynitride dopant layer may be deposited using in step d): 1) $H_2O$, $O_2$, or $O_3$, and $NH_3$, or 2) NO, $NO_2$, or $N_2O$, and optionally one or more of $H_2O$, $O_2$, $O_3$, and $NH_3$. According to some embodiments of the invention, the vapor phase precursor containing arsenic can include an arsenic halide, for example $AsCl_3$, $AsBr_3$, or $AsI_3$.

According to one embodiment, a phosphorous dopant layer may include phosphorous oxide, phosphorous nitride, or phosphorous oxynitride. According to other embodiments, the phosphorous dopant layer can contain or consist of a phosphorous doped high-k material in the form of an oxide layer, a nitride layer, or an oxynitride layer. In one example, a phosphorous oxide dopant layer may be deposited by ALD by a) providing a substrate in a process chamber configured for performing an ALD process, b) exposing the substrate to a vapor phase precursor containing phosphorous, c) purging/evacuating the process chamber, d) exposing the substrate to a reactant gas containing $H_2O$, $O_2$, or $O_3$, a combination thereof, e) purging/evacuating the process chamber, and f) repeating steps b)-e) any number of times until the phosphorous oxide dopant layer has a desired thickness. According to other embodiments, a phosphorous nitride dopant layer may be deposited using a reactant gas containing $NH_3$ in step d), or a phosphorous oxynitride dopant layer may be deposited using a reactant gas containing in step d): 1) $H_2O$, $O_2$, or $O_3$, and $NH_3$, or 2) NO, $NO_2$, or $N_2O$, and optionally one or more of $H_2O$, $O_2$, $O_3$, and $NH_3$. According to some embodiments of the invention, the vapor phase precursor containing arsenic can include $[(CH_3)_2N]_3PO$, $P(CH_3)_3$, $PH_3$, $OP(C_6H_5)_3$, $OPCl_3$, $PCl_3$, $PBr_3$, $[(CH_3)_2N]_3P$, $P(C_4H_9)_3$.

A plurality of embodiments for ultra-shallow dopant region formation by solid phase diffusion from a dopant layer into a substrate layer has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming an ultra-shallow dopant region in a substrate, the method comprising:

depositing a dopant layer in direct contact with a recessed feature of the substrate, the dopant layer containing (i) a nitride, or (ii) an oxynitride, wherein the dopant layer contains a dopant selected from aluminum (Al), gallium (Ga), indium (In), thallium (Tl), nitrogen (N), phosphorous (P), arsenic (As), antimony (Sb), and bismuth (Bi), wherein in (i) the nitride is deposited by atomic layer deposition (ALD) using a reactant gas containing $NH_3$, and wherein in (ii) the oxynitride is deposited by ALD using a reactant gas containing a) $H_2O$, $O_2$, or $O_3$, and $NH_3$, or b) NO, $NO_2$ or $N_2O$, and optionally one or more of $H_2O$, $O_2$, $O_3$, and $NH_3$;

patterning the dopant layer; and forming the ultra-shallow dopant region in the recessed feature of the substrate by diffusing the dopant from the patterned dopant layer into the recessed feature of the substrate by a thermal treatment.

2. The method of claim 1, further comprising:
removing the patterned dopant layer from the substrate.

3. The method of claim 1, further comprising
depositing a cap layer on the dopant layer or on the patterned dopant layer.

4. The method of claim 3, further comprising:
removing the patterned dopant layer and the cap layer from the substrate.

5. The method of claim 1, wherein the substrate comprises Si, Ge, In, Ga, As, Sb, GaAs, InGaAs, InGaSb, or $Si_xGe_{1-x}$ wherein 0<x<1.

6. The method of claim 1, wherein a thickness of the dopant layer is 4 nm or less.

* * * * *